United States Patent
Banerjee et al.

(10) Patent No.: US 9,960,265 B1
(45) Date of Patent: May 1, 2018

(54) III-V SEMICONDUCTOR DEVICE AND METHOD THEREFOR

(71) Applicant: SEMICONDUCTOR COMPONENTS INDUSTRIES, LLC, Phoenix, AZ (US)

(72) Inventors: Abhishek Banerjee, Kruibeke (BE); Peter Moens, Erwetegem (BE); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/422,764

(22) Filed: Feb. 2, 2017

(51) Int. Cl.
*H01L 29/778* (2006.01)
*H01L 29/66* (2006.01)
*H01L 21/02* (2006.01)

(52) U.S. Cl.
CPC .... *H01L 29/7787* (2013.01); *H01L 21/02175* (2013.01); *H01L 21/02241* (2013.01); *H01L 29/66462* (2013.01)

(58) Field of Classification Search
CPC ........... H01L 29/7787; H01L 29/66462; H01L 21/02175; H01L 21/02241; H01L 29/66431; H01L 29/78; H01L 2924/13064; H01L 29/7782
See application file for complete search history.

(56) References Cited

U.S. PATENT DOCUMENTS

| | | | | |
|---|---|---|---|---|
| 6,849,882 B2 * | 2/2005 | Chavarkar | .......... | H01L 29/7783 257/191 |
| 8,124,505 B1 * | 2/2012 | Burnham | .......... | H01L 21/30621 257/E21.407 |
| 8,309,987 B2 * | 11/2012 | Derluyn | .............. | H01L 29/2003 257/192 |
| 8,431,960 B2 * | 4/2013 | Beach | ................. | H01L 21/0237 257/192 |
| 8,436,398 B2 * | 5/2013 | Lidow | ................. | H01L 29/1066 257/189 |
| 8,866,192 B1 * | 10/2014 | Chen | ................... | H01L 21/2652 257/194 |
| 8,901,609 B1 * | 12/2014 | Chen | ................. | H01L 29/66462 257/194 |
| 9,076,854 B2 * | 7/2015 | Liu | ...................... | H01L 29/7786 |
| 9,093,511 B2 * | 7/2015 | Chen | ................ | H01L 21/02458 |
| 9,245,991 B2 * | 1/2016 | Liu | .................... | H01L 29/66462 |
| 9,263,530 B2 * | 2/2016 | Cheng | ..................... | H01L 29/36 |
| 9,269,800 B2 * | 2/2016 | Cheng | ............... | H01L 29/66462 |
| 9,478,632 B2 * | 10/2016 | Liu | ...................... | H01L 29/7786 |
| 9,543,391 B2 * | 1/2017 | Hwang | ............. | H01L 29/42316 |
| 9,548,376 B2 * | 1/2017 | Liu | ................... | H01L 29/66462 |
| 2005/0110042 A1 * | 5/2005 | Saito | ...................... | H01L 29/402 257/192 |

(Continued)

*Primary Examiner* — Earl Taylor
(74) *Attorney, Agent, or Firm* — Robert F. Hightower

(57) ABSTRACT

In one embodiment, a III-V high electron mobility semiconductor device includes a semiconductor substrate including a GaN layer, an AlGaN layer on the GaN layer wherein a 2 DEG is formed near an interface of the GaN layer and the AlGaN layer. An insulator may be on at least a first portion of the AlGaN layer and a P-type GaN gate region may be overlying a second portion of the AlGaN layer wherein the 2 DEG does not underlie the P-type GaN gate region.

22 Claims, 3 Drawing Sheets

(56) References Cited

U.S. PATENT DOCUMENTS

| | | | |
|---|---|---|---|
| 2006/0124962 A1* | 6/2006 | Ueda | H01L 21/28581 257/192 |
| 2009/0072240 A1* | 3/2009 | Suh | H01L 29/2003 257/76 |
| 2010/0258841 A1* | 10/2010 | Lidow | H01L 29/1066 257/192 |
| 2012/0056191 A1* | 3/2012 | Endo | H01L 21/30612 257/76 |
| 2012/0112202 A1* | 5/2012 | Hwang | H01L 29/66462 257/76 |
| 2013/0099285 A1* | 4/2013 | Hwang | H01L 29/42316 257/194 |
| 2014/0008658 A1* | 1/2014 | Siemieniec | H01L 29/42372 257/76 |
| 2015/0021661 A1* | 1/2015 | Chen | H01L 21/02458 257/190 |
| 2015/0041825 A1* | 2/2015 | Liu | H01L 29/66462 257/77 |
| 2015/0053992 A1* | 2/2015 | Liu | H01L 29/7786 257/76 |
| 2015/0206962 A1* | 7/2015 | Chen | H01L 21/0251 257/76 |
| 2015/0236121 A1* | 8/2015 | Chiu | H01L 29/66462 257/194 |
| 2015/0236146 A1* | 8/2015 | Liu | H01L 29/66462 257/76 |
| 2015/0287806 A1* | 10/2015 | Liu | H01L 29/7786 438/172 |
| 2016/0111520 A1* | 4/2016 | Liu | H01L 29/66462 438/172 |

* cited by examiner

III-V SEMICONDUCTOR DEVICE AND METHOD THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form enhancement mode high electron mobility transistors (HEMTs). The HEMTs often were formed from compound semiconductor material from group III-V of the periodic table of elements. Those skilled in the art will understand that the new periodic table may refer to these elements as Group 13 and 15. The HEMTs often utilized a P-doped compound semiconductor material to deplete carriers and assist operating as an enhancement mode transistor. In some embodiments, the dopants from the P-doped semiconductor material diffused outward into other portions of the HEMT structure. This often resulted in decreasing the $R_{dsON}$ of the HEMT.

In some embodiments, the P-doped semiconductor material was patterned in order to facilitate the enhancement mode operation. In some formation methods, the patterning affected other portions of the HEMT which resulted in a higher dynamic $R_{dsON}$.

Additionally, some of the materials utilized to form gate electrodes resulted in high gate leakage currents, particularly when the gate voltage was high.

Accordingly, it is desirable to have an enhancement mode compound semiconductor HEMT that has a lower $R_{dsON}$, or that has a low or dynamic $R_{dsON}$, or that has a lower gate leakage current.

Figure 1:
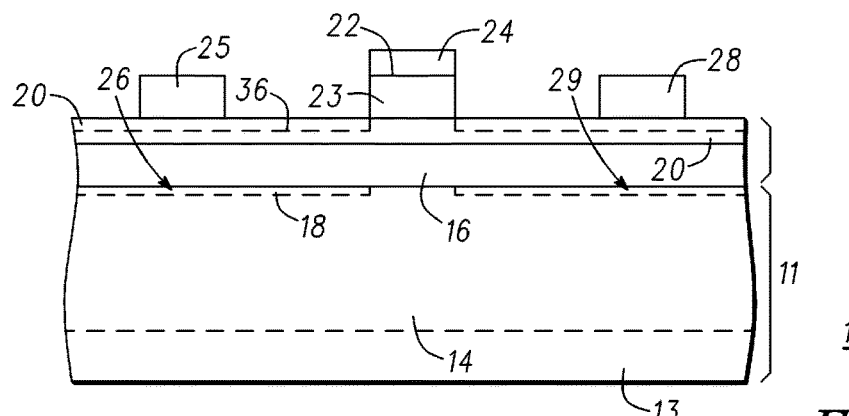
FIG. 1 illustrates an enlarged illustrates a cross-sectional portion of an example of an embodiment of an enhancement mode HEMT in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) (and up to twenty per cent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

FIG. 1 illustrates an enlarged cross-sectional portion of an example of an embodiment of an enhancement mode device or enhancement mode HEMT 10 that has a lower $R_{dsON}$. As will be seen further hereinafter, one embodiment of HEMT 10 includes a diffusion buffer layer that assists in forming the lower $R_{dsON}$. HEMT 10 includes a semiconductor substrate 11 that includes a group III-V channel layer 14. HEMT 10 also includes a layer 21 that is formed on substrate 11 and is formed of a group III-V material having an aluminum content. HEMT 10 may have an embodiment where layer 21 is formed on substrate 11 or alternately on layer 14. Layer 21 is configured to have an aluminum content (Al) that forms a two-dimensional electron gas (2 DEG) near an interface between layer 21 and layer 14. The 2 DEG is illustrated in a general manner by a dashed line 18. In one example embodiment, layer 21 may include one or more aluminum gallium nitride (AlGaN) layers. For example, layer 21 may have an embodiment that may include an AlGaN barrier layer or a first AlGaN layer 16 and an AlGaN diffusion buffer layer or a second AlGaN layer 20 formed on layer 16.

HEMT 10 also includes a gate structure that includes a P-doped group III-V material that is disposed on at least a portion of a surface of layer 21. In an embodiment, the P-doped group III-V material may be a P-doped GaN gate region or P-doped GaN region 23. A gate electrode 24 may be formed on region 23, for example on a surface 22 of region 23, to provide an electrical connection for the gate structure of HEMT 10. Those skilled in the art will appreciate that carriers are depleted from the portion of HEMT 10 that underlies the P-doped compound semiconductor material as is illustrated by a discontinuity in dashed line 18. Those skilled in the art will also appreciate that the portion of layer 14 in which the carriers are depleted from the 2 DEG, as illustrated by dashed line 18, forms a channel region of layer 14 and that during operation a voltage applied to the gate structure controls the flow of electrons through the channel region. HEMT 10 may have an embodiment where the channel region is formed in channel layer 14.

HEMT 10 may also include a source electrode 25 and a gate electrode 28 that may be formed as metal regions disposed on portions of layer 21, such as for example on portions of layer 20. The metal of electrodes 25 and 28 form an ohmic contact to layers 20 and 16 in order to collect and source electrons to the channel region. The source region and drain region of HEMT 10 may, in an embodiment, be considered to be the portions of layer 14 that underlie respective electrodes 25 and 28 as illustrated by respective arrows 26 and 29.

Those skilled in the art will appreciate that electrodes 24, 25, and 28 may be formed by a single metal or stacks of metals such as tungsten and/or titanium or other well-known electrode materials.

Figure 2:
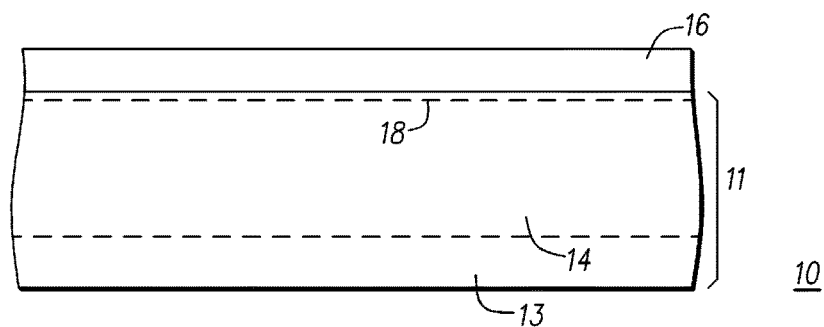
FIG. 2 illustrates a stage in an example of an embodiment of a method of forming the HEMT of FIG. 1 in accordance with the present invention.

FIG. 2 illustrates HEMT 10 at a stage in an example of an embodiment of a method of forming HEMT 10. In some embodiments, substrate 11 may include a bulk semiconductor substrate 13 on which layer 14 may be formed. Substrate 13 may include a compound semiconductor material or sapphire or silicon carbide or an insulator or many other types of well-known substrates onto which layer 14 may be formed. Subsequently, layer 16 is formed on layer 14. Layer 16 generally has an aluminum content that is large enough to create the 2 DEG near the interface of layers 16 and 14 as illustrated by dashed line 18. The 2 DEG may be formed in layer 14 or layer 16 or a combination thereof. Some embodiments may include that the aluminum content of layer 16 is no less than approximately ten percent (10%), in some embodiments, the aluminum content may be no less than approximately twenty five per cent (25%).

Figure 3:
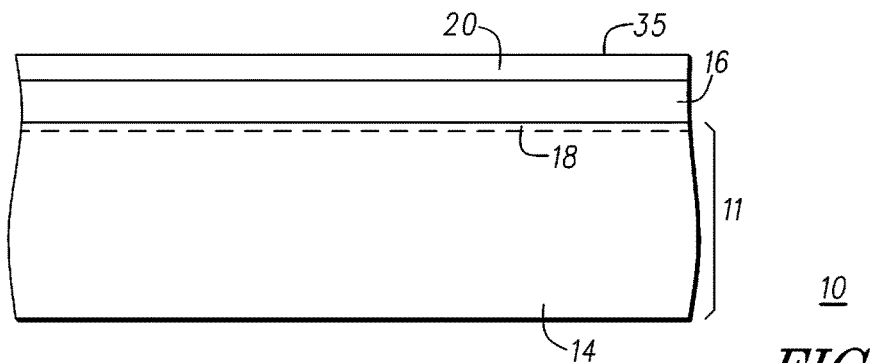
FIG. 3 illustrates a subsequent stage in the formation of the HEMT of FIG. 1 in accordance with the present invention.

FIG. 3 illustrates a subsequent stage in the formation of HEMT 10. Layer 20 may be formed on layer 16 by various methods such as by metal-organic chemical vapor deposition (MOCVD) or other well-known formation techniques. Layer 20 is formed with an aluminum content that decreases from a first amount at the interface with layer 16 to a lesser amount or second amount at a first surface or top surface 35 of layer 20. Surface 35 may be a surface that is on an opposite side of layer 20 from layer 16. An embodiment may include that the aluminum content of layer 20 decreases from an amount that is substantially equal to the aluminum content of layer 16 to a much lower amount at the surface of layer 20. For example, the lower amount may be substantially zero. In an embodiment, the decrease may occur inversely proportionally to the ratio of the distance from surface 35 to the total thickness of layer 16. For example, at the interface of layers 16 and 20, the ratio is one (1) and layer 20 has a starting Al content. In one example embodiment, the starting aluminum content of layer 20 may be substantially equal to the Al content that layer 16 has at the interface with layer 20. At one-half of the distance from surface 35 to the interface, the ratio is 0.5 and the aluminum content may be substantially one-half of the starting Al content of layer 20. At one-fourth of the distance from surface 35 to the interface, the ratio is 0.25 and the aluminum content may be substantially one-fourth of the starting Al content of layer 20. At surface 35, the ratio is zero and the aluminum content of layer 20 may be substantially zero. In other embodiments, the rate at which the Al content decreases may be different as long as the Al content decreases from a maximum at the interface with layer 16 to a minimum at surface 35. Those skilled in the art will appreciate that manufacturing methods such as MOCVD can very accurately controlled the aluminum content in each very thin layer that is used in the formation of layer 20, such as for example each atomic layer.

An embodiment may include forming layer 16 to have a thickness between approximately five and approximately forty (5-400) nano-meters thick. Layer 20 may be formed to have a thickness that is less than the thickness of layer 16. Layer 20 is preferred to be thin in order to assist in keeping the threshold voltage of HEMT 10 from shifting toward negative values. For example, layer 20 may have a thickness of approximately two to approximately ten (2-10) nano-meters.

Figure 4:
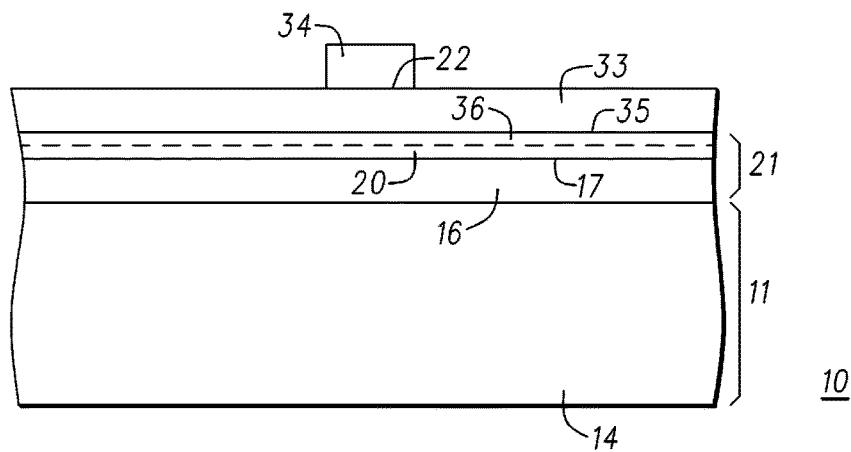
FIG. 4 illustrates an example of an embodiment of another subsequent formation stage in the formation of the HEMT of FIG. 1 in accordance with the present invention.

FIG. 4 illustrates HEMT 10 at an example of an embodiment of another subsequent formation stage. An embodiment of a method of forming the gate region, such as for example region 23 (FIG. 1), may include forming a layer 33 of a P-doped group III-V material on layer 21. An example embodiment may include forming layer 33 as P-doped GaN. The dopant material used to form the P-doping may be magnesium (Mg) or alternately may be other P-type dopants in group II of the periodic table of element, such as for example beryllium (Ba), calcium (Ca), strontium (Sr), Barium (Ba), or radium (Ra). Additionally, other P-type dopants may include carbon or iron. Layer 33 may be formed on the surface of layer 21, such as for example on top surface 35 of layer 20.

A mask material may be formed on layer 33 and patterned to form a mask 34 on surface 22. Mask 34 may be utilized for selectively removing portions of layer 33 external to the gate region of HEMT 10 (See FIG. 5).

Figure 5:
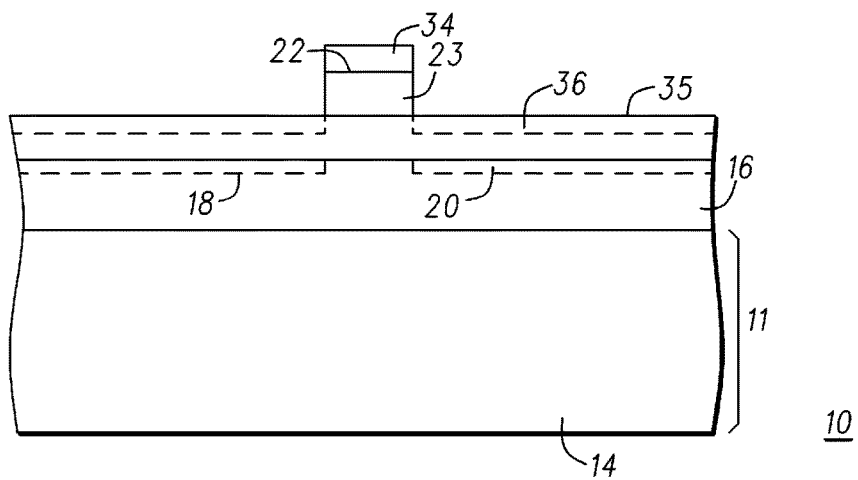
FIG. 5 illustrates an example of an embodiment of yet another subsequent formation stage in the formation of the HEMT of FIG. 1 in accordance with the present invention.

FIG. 5 illustrates another subsequent stage an example of an embodiment of forming HEMT 10. The portion of layer 33 may be selectively removed by various known techniques such as a dry etch or plasma etch using various chemistries such as for example a fluorine-based chemistry, or may be wet etched using various chemistries such as for example a fluorine based chemistry. During the patterning of layer 33, a portion of the surface of layer 20 that is external to, and in some embodiments may be adjacent to or alternately may abut, region 23 may be etched and a portion of surface 35 may be removed as illustrated by the thickness of layer 20 being reduced and surface 35 moving as illustrated by a dashed line 36. The aluminum in layer 20 acts as an etch stop that slows the etch rate into layer 20. As the Al content increases, the etch rate of the material of layer 20 decreases. Thus, the etching may remove a portion of layer 21 and reduce the thickness thereof until the Al content becomes sufficient to substantially stop the removal of layer 20. Some embodiments may remove approximately one or two (1-2) nano-meters of the thickness of layer 20.

During the formation of HEMT 10, some of the P-type dopants may out diffuse from layer 33 and move into layer 20. For example during the formation of layer 33 some of the P-type dopants may out diffuse and move into layer 21. However, the thickness of layer 20 is chosen to substantially prevent the dopants from diffusing through layer 20, t. Additionally, during the patterning of layer 33 and the associated reduction of the thickness of layer 21, the thickness of some of the portion of layer 20 into which the P-type dopants from layer 33 diffuse may be substantially reduced.

Figure 6:
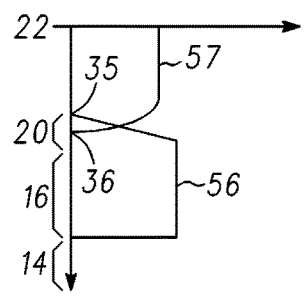
FIG. 6 is a graph having plots that illustrate in a general manner some of the material contents of some of the different layers of the HEMT of FIG. 1 in accordance with the present invention.

FIG. 6 is a graph having plots that illustrate in a general manner some of the material contents of some of the different layers of HEMT 10. The abscissa indicates a content or concentration of the illustrated material and the ordinate indicates depth into HEMT 10 from top surface 22 of region 23. A plot 56 illustrates, in a general manner, one non-limiting example of the variation of the aluminum content in layer 20, such as for example layers 20 and 16. A plot 57 illustrates, in a general manner, one non-limiting example of the variation of the doping concentration of the material used for the P-type doping as it may vary through region 23 and layers 20 and 16.

As is illustrated in FIG. 6, the P-type doping concentration in layer 20 decreases with distance into layer 20. An embodiment may include that the P-type doping concentration in layer 20 may be reduced to substantially zero before reaching layer 16. An embodiment may include that layer 20 substantially stops any of the P-type dopants from diffusing into layer 16, thereby substantially preventing the P-type doping from affecting the $R_{DSon}$ of HEMT 10. As illustrated in a general manner by FIG. 6, the aluminum content of layer 21 increases with distance from the surface of layer 20, either surface 35 or 36, toward the interface with layer 16. Also the P-type doping concentration in layer 20 decreases with distance from the surface of layer 20, either surface 35 or 36, toward the interface with layer 16. Those skilled in the art will appreciate that all of the P-type dopants may not be removed from layer 20 by the thickness reduction of layer 20 but the doping concentration is reduced to a level that has substantially no effect on the $R_{DSon}$ of HEMT 10. For example, the P-type doping material is substantially prevented from diffusing into layer 16 which is the layer that assists in forming the 2 DEG with layer 16. Reducing the P-type doping concentration in layer 20 assists in keeping the $R_{dson}$ low and keeping layer 20 thin assist in keeping region 23 close enough to layer 16 to minimize shifting the threshold voltage toward a negative value.

Those skilled in the art will appreciate that in those embodiments in which the thickness of layer 20 is reduced, the Al content of layer 20 may no longer be substantially zero at the top surface of the reduced thickness of layer 20. However, the Al content will still decrease from a maximum at the interface with layer 16 to a minimum at the top surface of layer 20 with the reduced thickness, but the rate at which it decreases with distance may be different than as explained hereinbefore regarding FIG. 3.

Figure 7:
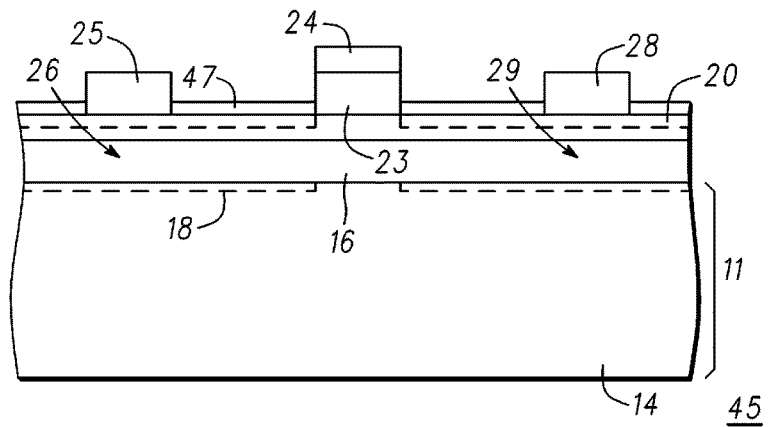
FIG. 7 illustrates a cross-sectional portion of an example of an embodiment of a compound semiconductor HEMT that may have an embodiment that may be an alternate embodiment of the HEMT of FIG. 1 in accordance with the present invention.

FIG. 7 illustrates a cross-sectional portion of an example of an embodiment of a compound semiconductor HEMT 45 that may have an embodiment that may be an alternate embodiment of HEMT 10. HEMT 45 is substantially the same as that 10, however, HEMT 45 includes an insulator layer or insulator 47 on the surface of layer 21. In one embodiment, insulator 47 is formed on layer 20 of layer 21.

Figure 8:
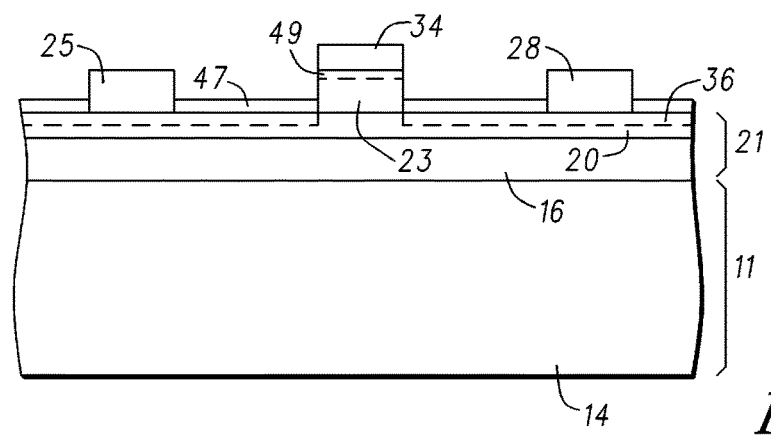
FIG. 8 illustrates an example of an embodiment of a stage in the manufacturing of the HEMT of FIG. 7 in accordance with the present invention.

FIG. 8 illustrates an example of an embodiment of HEMT 45 at a stage in the manufacturing of HEMT 45. Assume for example that the method of forming HEMT 45 begins at a stage that is substantially similar to the stage illustrated in FIG. 4. Thereafter, a portion of layer 33 external to mask 34 is removed leaving gate region 23. As explained hereinbefore, the process of patterning layer 33 to form region 23 may, or alternately may not, etch a portion of layer 20 as illustrated by dashed line 36. Subsequently, insulator 47 is formed on the exposed portion of the surface of layer 20. In some embodiments, insulator 47 may abut region 23. In one example method, insulator 47 may be formed by oxidizing the exposed surface of layer 20. In one example embodiment, the surface of layer 20 was oxidized at a temperature between eight hundred and eight hundred fifty degrees Celsius (800-850° C.) for approximately thirty (30) minutes. The material of insulator 47 may be an oxide of aluminum, Gallium, hafnium, lanthanum, or an oxide of a well-known material or may be silicon nitride, silicon dioxide, or silicon oxide. In some embodiments, insulator 47 may be any one of or a combination of an aluminum oxide ($Al_2O_3$) and/or an aluminum oxy-nitride (AlON) and/or aluminum gallium oxide (AlGaO) and/or aluminum gallium oxy-nitride (AL-GaON). Insulator 47 may also be formed by other techniques such as for example depositing or growing the insulator material onto the surface of layer 20. For example, insulator 47 may be formed by techniques such as plasms enhanced CVD (PECVD), plasma enhanced atomic layer deposition (PEALD), low pressure CVD (LPCVD), or other known techniques. Subsequently, insulator 47 may be patterned with openings where source and drain electrodes 25 and 28, respectively, are to be formed to expose the surface of layer 21. Thereafter the material of electrodes 25 and 28 may be formed within the openings, and alternately also on insulator 47 and patterned to form electrodes 25 and 28. Some embodiments may include subsequently the material of electrodes 25 and 28 may be alloyed in a nitrogen environment to assist in forming the ohmic connection thereto.

In another embodiment, mask 34 may be removed before insulator 47 is formed thereby also forming an insulator 49 on region 23 (illustrated in general by a dashed line). Thereafter, gate electrode 24 may be formed on insulator 49. Insulator 49 would assist in reducing electron injection from the material of electrode 24 thereby further reducing the leakage current of HEMT 45.

Those skilled in the art will appreciate that the material of insulator 47, and alternately insulator 49, may be further annealed at elevated temperatures and alternately in other environments to improve the crystalline quality of insulator 47.

The etching that is used to pattern layer 33 into region 23 can damage the surface of layer 20 which can result in high dynamic $R_{dson}$. Forming insulator 47 assists in correcting the damage and results in lower dynamic $R_{dson}$. Also, the metals used to form gatge electrode 24 can result in high gate leakage currents. Forming insulator 49 on region 23 and forming electrode 24 on insulator 49 reduces the gate leakage current.

Figure 9:
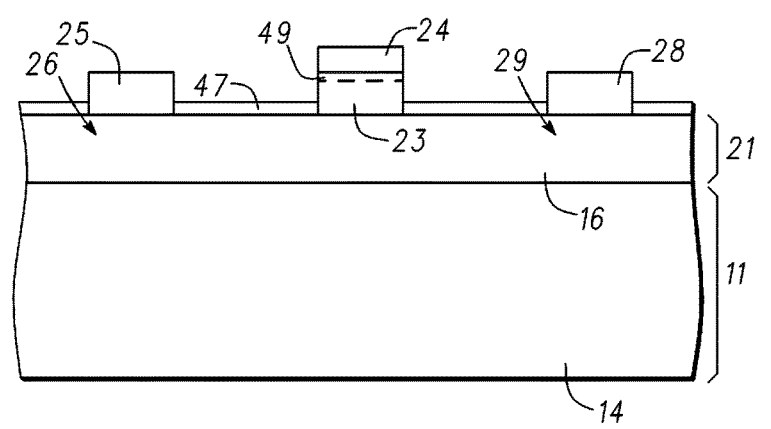
FIG. 9 illustrates a cross-sectional portion of an example of an embodiment of an enhancement mode HEMT that may be an alternate embodiment of the HEMT of FIG. 1 or FIG. 7 in accordance with the present invention.

FIG. 9 illustrates a cross-sectional portion of an example of an embodiment of an enhancement mode HEMT 50 that may be an alternate embodiment of HEMT 10 or alternately of HEMT 45. HEMT 50 is similar to HEMT 45 however, layer 20 is omitted, and insulator 47 is formed on the surface of layer 21, such as for example formed on the surface of layer 16 instead of on the surface of layer 20.

From all the foregoing, one skilled in the art will appreciate that an embodiment of a GaN enhancement mode HEMT may comprise:

a semiconductor substrate, such as for example substrate 11, having a GaN channel layer;

an AlGaN barrier layer, such as for example layer 16, having a first aluminum content, the AlGaN barrier layer on the GaN channel layer and forming a 2 DEG region adjacent an interface between the GaN channel layer and the AlGaN barrier layer;

an AlGaN diffusion buffer layer, such as for example layer 20, on the AlGaN barrier layer (16), the AlGaN diffusion buffer layer having a second aluminum content that decreases with a distance away from the AlGaN barrier layer wherein a GaN content increases with the distance away from the AlGaN barrier layer; and a P-type GaN gate layer, such as for example layer 23, on a first portion of the AlGaN diffusion buffer layer.

Another embodiment of the HEMT may also include an insulator layer on a second portion of the AlGaN diffusion buffer layer and abutting the P-type GaN gate layer, such as for example layer 23, the insulator layer including aluminum.

In another embodiment, the HEMT may also include an insulator layer on a second portion of the AlGaN diffusion buffer layer and abutting the P-type GaN gate layer, such as for example layer 23, the insulator layer including one or more of an oxide of aluminum or an oxide of gallium.

An embodiment may include that a maximum value of the second aluminum content is no greater than the first aluminum content.

Another embodiment may include that the second aluminum content decreases to substantially zero.

In some embodiments, the first aluminum content may be no less than substantially five percent (5%).

An embodiment may include that a thickness of the AlGaN barrier layer (16) is approximately five to forty nano-meters.

The HEMT may include an embodiment wherein a thickness of the AlGaN diffusion buffer layer, such as for example layer 20, may be approximately two to ten nano-meters.

Those skilled in the art will also appreciate that a method of forming an enhancement mode compound semiconductor FET may comprise:

forming a GaN, such as for example layer 14, layer;

forming an AlGaN layer, such as for example layer 21, on the GaN layer wherein a 2 DEG is formed near an interface of the GaN layer and the AlGaN layer;

forming a P-type GaN region, such as for example region 23, on the AlGaN layer;

oxidizing portions of the AlGaN layer that are adjacent the P-type GaN region to form a first insulator, such as for example insulator 47, on the AlGaN layer; and removing portions of the first insulator to expose underlying first portions of the AlGaN layer and forming source and drain electrodes, such as for example electrodes 25 and 28, on the exposed first portions of the AlGaN layer.

Another embodiment of the method may also include forming an AlGaN layer on the GaN layer includes forming a first AlGaN layer, such as for example layer 16, on the GaN layer wherein the 2 DEG is formed near an interface of the first AlGaN layer and the GaN layer, and forming a second AlGaN layer, such as for example layer 20, on the first AlGaN layer wherein an Al content of the second AlGaN layer decreases with increased distance from the first AlGaN layer.

The method may also include oxidizing a surface of the P-type GaN region to for a second insulator (49) on the P-type GaN layer, and further including forming a gate electrode on the second insulator.

The method may have an embodiment that may include oxidizing the surface of the P-type GaN region includes forming the second insulator to include an oxide of Ga.

An embodiment may also include forming the second insulator to include at least one of $Ga_2O_3$ or GaON.

In an embodiment, the method may also include oxidizing at a temperature between approximately 700 and approximately 900 degrees Celsius.

Another embodiment may also include forming a blanket layer of a P-type GaN layer (33) and removing a first portion of the P-type GaN layer to leave a second portion of the P-type GaN layer as the P-type GaN region.

An embodiment may also include etching the first portion of the P-type GaN layer and using the AlGaN layer as an etch stop wherein the etching removes approximately one or more nano-meters of the AlGaN layer (36).

Those skilled in the art will also appreciate that an embodiment of an enhancement mode GaN FET may comprise:

a semiconductor substrate, such as for example substrate 11, including a GaN layer, such as for example layer 14;

an AlGaN layer, such as for example layer 21 on the GaN layer wherein a 2 DEG is formed near an interface of the GaN layer and the AlGaN layer;

an insulator, such as for example insulator 47, on at least a first portion of the AlGaN layer;

a P-type GaN gate region, such as for example region 23, overlying a second portion of the AlGaN layer wherein the 2 DEG does not underlie the P-type GaN gate region;

a source electrode overlying a third portion of the AlGaN layer; and a drain electrode overlying a fourth portion of the AlGaN layer.

Another embodiment may also include the insulator may be on the second portion of the AlGaN layer and the P-type GaN gate region is on the insulator.

In an embodiment, the insulator may not be on the second portion of the AlGaN layer and the P-type GaN gate region is on second portion of the AlGaN layer.

Another embodiment may include that the AlGaN layer may include a first AlGaN layer, such as for example layer 16, on the GaN layer, such as for example layer 14, wherein the 2 DEG is formed near an interface of the first AlGaN layer and the GaN layer, and a second AlGaN layer, such as for example layer 20, on the first AlGaN layer wherein an Al content of the second AlGaN layer decreases with increased distance from the first AlGaN layer.

An embodiment may include that the source and drain electrodes may be on the AlGaN layer and protrude through the insulator.

Another embodiment may include that the insulator may be formed by depositing the insulator on the AlGaN layer.

In view of all of the above, it is evident that a novel device and method is disclosed. Included, among other features, is forming a HEMT device that has an aluminum content that increases with increasing distance from an interface with P-type gate region or alternately that decreases with increasing distance from an interface with an underlying aluminum containing layer. The changing or varying Al content reduces the diffusion rate of the P-type dopants in the layer from the adjacent layer. Also, removing a portion of the layer having the out diffused P-type dopants reduces the P-type dopants that can affect the barrier layer and the Rdson of the HEMT.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of HEMT 10 is used as a vehicle to explain the structure of and method of making the decreasing Al content. However, the method and structures can be used for other types of devices, such as a HEM diode or other HEM device.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A GaN enhancement mode HEMT comprising:
a semiconductor substrate having a GaN channel layer;
an AlGaN barrier layer having a first aluminum content, the AlGaN barrier layer on the GaN channel layer and forming a 2 DEG region adjacent an interface between the GaN channel layer and the AlGaN barrier layer;
an AlGaN diffusion buffer layer on the AlGaN barrier layer, the AlGaN diffusion buffer layer having a second aluminum content that decreases with a distance away from the AlGaN barrier layer wherein a GaN content increases with the distance away from the AlGaN barrier layer; and
a P-type GaN gate layer on a first portion of the AlGaN diffusion buffer layer.

2. The HEMT of claim 1 further including an insulator layer on a second portion of the AlGaN diffusion buffer layer and abutting the P-type GaN gate layer, the insulator layer including aluminum.

3. The HEMT of claim 1 further including an insulator layer on a second portion of the AlGaN diffusion buffer layer and abutting the P-type GaN gate layer, the insulator layer including one or more of an oxide of aluminum or an oxide of gallium.

4. The HEMT of claim 1 wherein a maximum value of the second aluminum content is no greater than the first aluminum content.

5. The HEMT of claim 1 wherein the second aluminum content decreases to substantially zero.

6. The HEMT of claim 1 wherein the first aluminum content is no less than substantially five percent (5%).

7. The HEMT of claim 1 wherein a thickness of the AlGaN barrier layer is approximately five to forty nano-meters.

8. The HEMT of claim 7 wherein a thickness of the AlGaN diffusion buffer layer is approximately two to ten nano-meters.

9. A method of forming an enhancement mode compound semiconductor FET comprising:
forming a GaN layer;
forming an AlGaN layer on the GaN layer wherein a 2 DEG is formed near an interface of the GaN layer and the AlGaN layer;
forming a P-type GaN region on the AlGaN layer;
oxidizing portions of the AlGaN layer that are adjacent the P-type GaN region to form a first insulator on the AlGaN layer; and
removing portions of the first insulator to expose underlying first portions of the AlGaN layer and forming source and drain electrodes on the exposed first portions of the AlGaN layer.

10. The method of claim 9 wherein forming an AlGaN layer on the GaN layer includes forming a first AlGaN layer on the GaN layer wherein the 2 DEG is formed near an interface of the first AlGaN layer and the GaN layer, and forming a second AlGaN layer on the first AlGaN layer wherein an Al content of the second AlGaN layer decreases with increased distance from the first AlGaN layer.

11. The method of claim 9 wherein oxidizing portions of the AlGaN layer includes oxidizing a surface of the P-type GaN region to for a second insulator on the P-type GaN layer, and further including forming a gate electrode on the second insulator.

12. The method of claim 11 wherein oxidizing the surface of the P-type GaN region includes forming the second insulator to include an oxide of Ga.

13. The method of claim 12 further including forming the second insulator to include at least one of $Ga_2O_3$ or GaON.

14. The method of claim 9 wherein oxidizing portions of the AlGaN layer includes oxidizing at a temperature between approximately 700 and approximately 900 degrees Celsius.

15. The method of claim 9 wherein forming the P-type GaN region on the AlGaN layer includes forming a blanket layer of a P-type GaN layer and removing a first portion of the P-type GaN layer to leave a second portion of the P-type GaN layer as the P-type GaN region.

16. The method of claim 15 wherein removing the first portion of the P-type GaN layer includes etching the first portion of the P-type GaN layer and using the AlGaN layer as an etch stop wherein the etching removes approximately one or more nano-meters of the AlGaN layer.

17. An enhancement mode GaN FET comprising:
a semiconductor substrate including a GaN layer;
an AlGaN layer on the GaN layer wherein a 2 DEG is formed near an interface of the GaN layer and the AlGaN layer, the AlGaN layer having a surface that is opposite to the interface with the GaN layer, the AlGaN layer having an aluminum content that increases with distance from the surface toward the interface for at least a portion of a first distance from the surface toward the interface;
an insulator on at least a first portion of the AlGaN layer;
a P-type GaN gate region overlying a second portion of the AlGaN layer wherein the 2 DEG does not underlie the P-type GaN gate region;
a source electrode overlying a third portion of the AlGaN layer; and
a drain electrode overlying a fourth portion of the AlGaN layer.

18. The FET of claim 17 wherein the insulator is on the second portion of the AlGaN layer and the P-type GaN gate region is on the insulator.

19. The FET of claim 17 wherein the insulator is not on the second portion of the AlGaN layer and the P-type GaN gate region is on second portion of the AlGaN layer.

20. The FET of claim 17 wherein the AlGaN layer includes a first AlGaN layer on the GaN layer wherein the 2 DEG is formed near an interface of the first AlGaN layer and the GaN layer, and a second AlGaN layer on the first AlGaN layer wherein an Al content of the second AlGaN layer decreases with increases of a second distance from the first AlGaN layer.

21. The FET of claim 17 wherein the source and drain electrodes are on the AlGaN layer and protrude through the insulator.

22. The FET of claim 17 wherein the insulator is formed by depositing the insulator on the AlGaN layer.

* * * * *